US006392448B1

(12) United States Patent
Vadipour

(10) Patent No.: US 6,392,448 B1
(45) Date of Patent: May 21, 2002

(54) COMMON-MODE DETECTION CIRCUIT WITH CROSS-COUPLED COMPENSATION

(75) Inventor: Morteza Vadipour, Woodland Hills, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/497,775

(22) Filed: Feb. 3, 2000

(51) Int. Cl.[7] .............................................. H03F 3/45
(52) U.S. Cl. ............................ 327/51; 327/55; 327/65; 327/563
(58) Field of Search ............................ 327/52, 55, 63, 327/65, 51, 560, 563; 330/253, 254, 255, 252

(56) References Cited

U.S. PATENT DOCUMENTS

| 4,754,169 A | 6/1988 | Morris ........................ 327/307 |
| 5,245,223 A | 9/1993 | Lim et al. ...................... 327/80 |
| 5,355,391 A | 10/1994 | Horowitz et al. .............. 375/36 |
| 5,416,484 A | 5/1995 | Lofstrom ..................... 341/159 |
| 5,512,848 A | 4/1996 | Yaklin .......................... 327/65 |
| 5,517,134 A | 5/1996 | Yaklin .......................... 327/65 |
| 5,530,444 A | 6/1996 | Tice et al. .................... 341/156 |
| 5,541,538 A | 7/1996 | Bacrania et al. ............... 327/77 |
| 5,563,598 A | 10/1996 | Hickling ...................... 341/161 |
| 5,701,331 A | 12/1997 | Hunt ........................... 375/316 |
| 5,757,215 A * | 5/1998 | Schuelke et al. ............ 327/110 |
| 5,764,086 A | 6/1998 | Nagamatsu et al. ........... 327/65 |
| 5,801,554 A | 9/1998 | Momma et al. ............... 327/89 |
| 5,812,005 A | 9/1998 | Ezell et al. ................... 327/307 |
| 5,864,587 A | 1/1999 | Hunt ........................... 357/316 |
| 5,912,567 A | 6/1999 | Drost et al. .................... 327/89 |
| 5,942,921 A | 8/1999 | Talaga, Jr. .................... 327/77 |
| 5,973,957 A | 10/1999 | Tedrow ................... 365/185.03 |
| 5,996,102 A | 11/1999 | Haulin ........................ 714/740 |
| 5,999,028 A | 12/1999 | Knoch et al. ................ 327/165 |
| 6,016,566 A | 1/2000 | Yoshida ....................... 714/736 |
| 6,100,758 A * | 8/2000 | Klemmer ..................... 330/252 |
| 6,137,362 A * | 10/2000 | Dufossez ..................... 330/254 |

* cited by examiner

Primary Examiner—Tuan T. Lam
Assistant Examiner—Hiep Nguyen
(74) Attorney, Agent, or Firm—Lance Kreisman

(57) ABSTRACT

A common-mode detection circuit for measuring a common-mode signal between two complementary signals is disclosed. The common-mode detection circuit includes a first signal divider circuit and a linearizer. The signal divider circuit includes a pair of impedances coupled to define a measurement node and respective first and second inputs. The divider further includes a pair of active buffer amplifiers having respective first and seconds outputs for coupling to the signal divider first and second inputs. The linearizer includes respective first and second inputs cross-coupled to the respective second and first buffer amplifier outputs and is operative to maintain both of the buffer amplifiers in a relatively constant operational state.

3 Claims, 3 Drawing Sheets

COMMON-MODE DETECTION CIRCUIT WITH CROSS-COUPLED COMPENSATION

FIELD OF THE INVENTION

The invention relates generally to common-mode detection circuitry, and more particularly a common-mode detection circuit having cross-coupled compensation circuitry for improving the linearization of a measureds common-mode signal derived from two complementary differential signals.

BACKGROUND OF THE INVENTION

Differential signaling is fast becoming an extremely important form of data transmission. Based on the general concept of processing a quantity comprising the difference between two complementary signals V2 and V1, the technique minimizes noise degradation by essentially rejecting signal components common to the complementary signals, often referred to as the common-mode voltage Vcm. This allows for the propagation of very high speed digital signals having relatively small voltage swings with minimal signal distortion.

One type of differential signaling technique is defined by IEEE-1394, known in one form under the trademark FIREWIRE®. Generally, the technology utilizes a 100/200/400 Mbit/sec serial protocol that codes changing values of the differential common-mode voltage to indicate the signal data rate in Mbit/sec. The protocol is ideal for interfacing computers to video equipment for frame-grabbing and editing applications.

FIG. 1 illustrates a FIREWIRE® waveform with two values of the common-mode voltage Vcm1 and Vcm2. The common-mode voltage Vcm1 might represent, for example, 50 Mbit/sec, while the voltage Vcm2 might represent 100 Mbit/sec. As shown, the common-mode voltage closely approximates the average value of the input differential signals Vx1, Vy1, and Vx2, Vy2. Thus, to detect and measure the common-mode voltage level, one merely needs to derive the median or average value of the input differential signals.

In general, measuring or detecting the average value between two signals is often realized by implementing straightforward components. For example, as shown in FIG. 2A, to measure the average voltage between two voltages Vx and Vy, a voltage divider comprising a pair of equal resistors R may be implemented. The measured value, Vm, satisfies the relationship (Vx+Vy)/2, the average voltage. A similar approach may be used for current detection using a straightforward current divider scheme.

Unfortunately, in some instances, when the straightforward components described above are implemented in sensitive electronic circuitry, such as the pin electronics of a semiconductor tester, and more particularly a differential comparator, the conventional averaging circuit may undesirably load both inputs. In an effort to minimize loading effects, those skilled in the art have proposed buffering the inputs with active buffer amplifiers 10 and 12 to isolate the divider from the inputs, as shown in FIG. 2B.

While the buffered input proposal noted above generally solves the loading problem, in some circumstances, the inventor has discovered that the derived output experiences a nonlinear relationship with respect to the differential signal inputs. The problem appears pronounced when the differential inputs comprise a wide range of high, Vh, and low, Vl, input differential signals.

For bipolar transistor implementations of the buffered input proposal, the nonlinearities often arise because of changing values in the base-to-emitter voltages, Vbe (not shown), of both buffers 10 and 12 in response to the differential high and low signal inputs Vh and Vl. For example, if Vx is much higher than Vy, virtually all of the current will flow through the first buffer 10, resulting in the second buffer 12 shutting down, and imbalancing the voltage at each input of the divider, correspondingly affecting the detected average voltage at Vm.

What is needed and heretofore unavailable is a common-mode detection circuit for measuring the common-mode signal associated with a differential signal that avoids the nonlinearities inherent with active buffer amplifiers to maintain a constant output with respect to a wide range of differential input signal values. Moreover, the need exists for the implementation of such a circuit in a high-speed and high-accuracy semiconductor tester. The common-mode detection circuit of the present invention satisfies these needs.

SUMMARY OF THE INVENTION

The common-mode detection circuit of the present invention provides high accuracy semiconductor device testing for high bandwidth applications while minimizing nonlinear effects. This correspondingly results in higher tester accuracy and performance.

To realize the foregoing advantages, the invention in one form comprises a common-mode detection circuit for measuring a common-mode signal between two complementary signals. The common-mode detection circuit includes a first signal divider circuit and a linearizer. The signal divider circuit includes a pair of impedances coupled to define a measurement node and respective first and second inputs. The divider further includes a pair of active buffer amplifiers having respective first and second outputs for coupling to the signal divider first and second inputs. The linearizer includes respective first and second inputs cross-coupled to the respective second and first buffer amplifier outputs and is operative to maintain both of the buffer amplifiers in a relatively constant operational state.

In another form, the invention comprises a method of measuring the common-mode signal between two complementary signals. The method includes the steps of buffering the complementary signal values through respective first and second amplifiers; dividing the summed values of the complementary signals across a signal divider disposed between the buffer amplifiers; and linearizing the divided signal by maintaining the buffer amplifiers in a substantially constant operational state.

Other features and advantages of the present invention will be apparent from the following detailed description when read in conjunction with the accompanying drawings.

DESCRIPTION OF THE DRAWINGS

The invention will be better understood by reference to the following more detailed description and accompanying drawings in which.

DETAILED DESCRIPTION OF THE INVENTION

Figure 1:
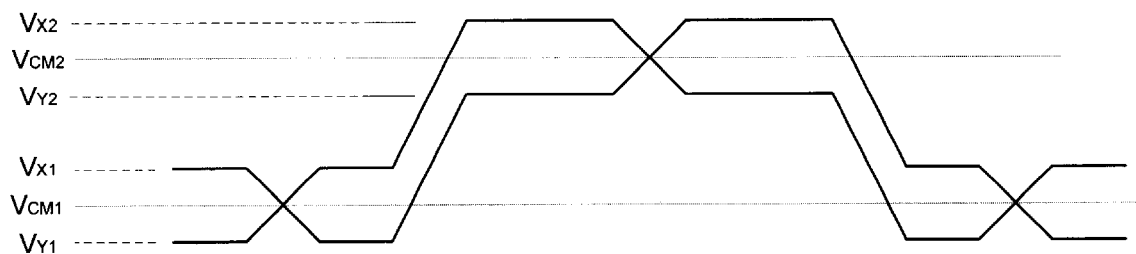
FIG. 1 is a graphical illustration of a typical IEEE-1394 waveform.
Figure 2A:
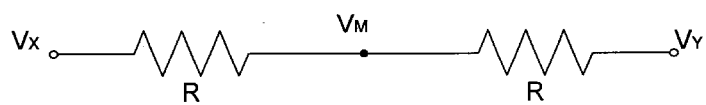
FIGS. 2A and 2B are proposed averaging circuits.
Figure 2B:
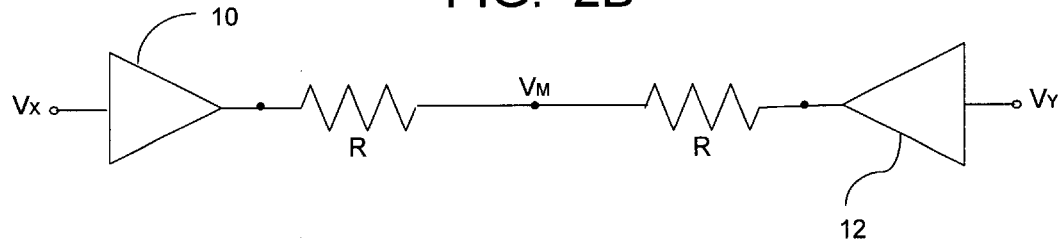
Figure 3:
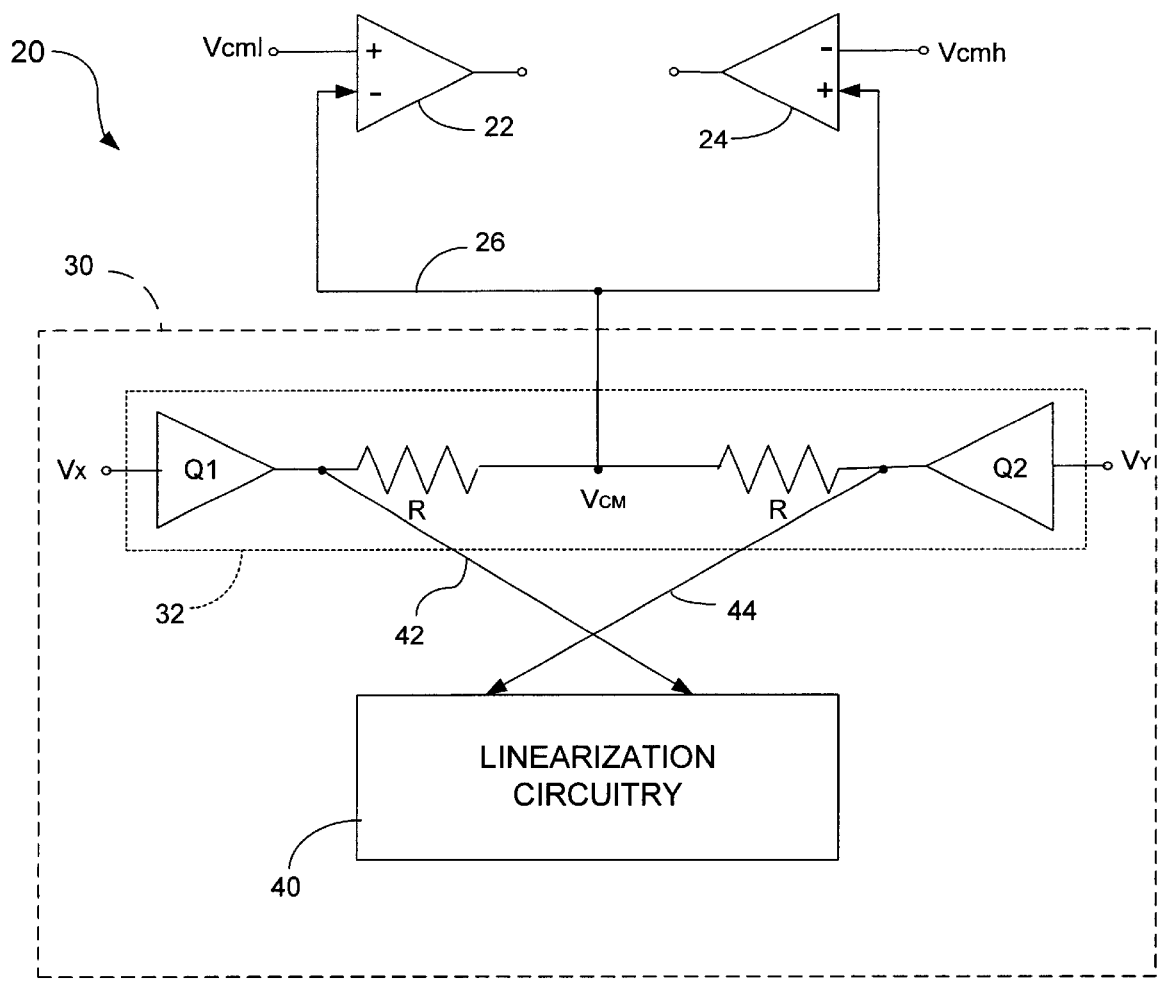
FIG. 3 is a high-level block diagram of a common-mode comparator circuit including a common-mode detection circuit according to one embodiment of the present invention.

Detecting and measuring common-mode signals is important in a variety of electronic applications including operational amplifiers, filters and gain blocks. The circuitry often implemented to carry out the common-mode detection function typically utilizes active and passive components that cooperate to achieve a certain level of required accuracy in the measured result. Unfortunately, nonlinearities inherent in the active components often have significant impacts in the obtainable accuracy of the detection circuit. Referring to FIG. 3, in an effort to compensate for these nonlinearities the common-mode comparator circuit of the present invention, generally designated 30, employs linearization circuitry 40 to maximize the linear range of a detected common-mode signal with respect to its complementary signal inputs.

Figure 4:
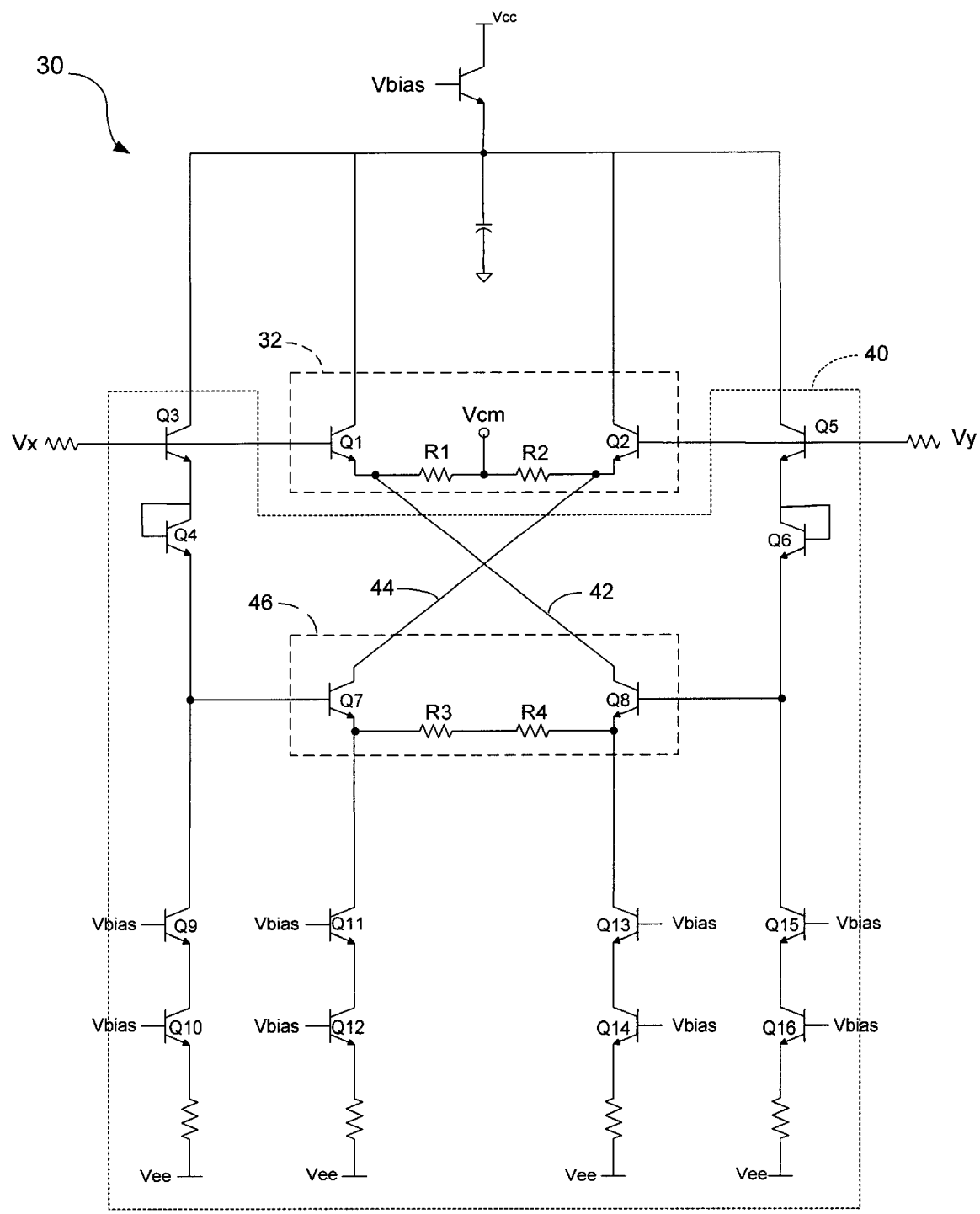
FIG. 4 is a detailed schematic of the common-mode detection circuit of FIG. 3.

With continued reference to FIG. 3, the common-mode detection circuit 30 generally includes a first active voltage divider 32 and the linearization circuitry 40 that cross-couples to the divider. The first active voltage divider comprises a pair of buffer amplifiers Q1 and Q2 having respective inputs for receiving complementary differential output signal components Vx and Vy. As shown in FIG. 4, the buffer amplifiers may be realized in one embodiment as respective BJT emitter followers. Interposed between the buffer amplifier outputs are a pair of series connected resistors R1 and R2 that are substantially equal in resistance and share a common connection that defines a common-mode detection node 45.

Referring now to FIGS. 3 and 4, the linearization circuitry 40 includes source current paths 42 and 44 cross-coupled to the outputs of the buffer amplifiers Q1 and Q2. With particular reference to FIG. 4, the linearization circuitry is selected to maintain a substantially constant current through both buffer amplifiers over a wide range of differing complementary voltage inputs.

In one specific embodiment, shown with continued reference to FIG. 4, the linearization circuitry 40 includes a second voltage divider 46 formed substantially similar to the first divider 32. The inputs to the second divider originate as the Vx and Vy differential signals and are fed through level shifting input transistors Q3, Q4, and Q5, Q6 to a pair of active buffers Q7 and Q8. The active buffers have respective outputs separated by a plurality of series-coupled resistors R3 and R4. The cross-coupling of the second divider 46 to the first divider 32 involves connecting the respective collectors of transistors Q7 and Q8 to the emitter outputs of transistors Q1 and Q2. A plurality of current sources comprising series transistor pairs Q9, Q10 and Q11, Q12, and Q13, Q14, and Q15, Q16 bias the level shifting circuitry and the second divider buffers Q7 and Q8.

The construction of the common-mode detection circuit of the present invention lends itself well to implementation on an integrated circuit. One particularly advantageous application includes implementation in a semiconductor tester channel architecture. Such an architecture for differential channels generally includes a differential driver (not shown) to stimulate a differential input port of a device-under-test (DUT), and a differential comparator to detect and compare the DUT differential output to a predefined set of parameters. The common-mode detection circuit 30 complements the tester channel architecture by providing a measurement of the common-mode signal for the comparator to compare against a predefined threshold. Examples of respective driver and comparator constructions are disclosed in pending U.S. patent application Ser. No. 09/525,557, filed Mar. 15, 2000, titled "Detector With Common Mode Comparator For Automatic Test Equipment", assigned to the assignee of the present invention, and expressly incorporated herein by reference.

When implemented as part of a differential common-mode comparator, generally designated 20 in FIG. 3, the common-mode detection circuit 30 provides a common-mode voltage Vcm to a common-mode bus 26. The bus feeds the detected voltage to a window comparator comprising a pair of differential amplifiers 22 and 24. The first differential amplifier 22 receives at its non-inverting (+) input a first low threshold voltage Vcml while the inverting input (−) receives the detected common-mode voltage Vcm. Similarly, the second differential amplifier 24 receives at its inverting input a high threshold Vcmh, and the detected common-mode voltage Vcm at its non-inverting input.

In operation, and referring now to FIG. 4, the common-mode detection circuit 30 receives the complementary differential signals Vx and Vy at the inputs of the respective buffer amplifiers Q1 and Q2 of the first divider 32. The input signals are also fed-forward through transistors Q3, Q4 and Q5, Q6 to the buffer amplifiers Q7 and Q8 of the second divider 46.

The purpose of the linearization circuit 46 is to keep the voltage Vbe of transistors Q1 and Q2 constant in the presence of differential input Vx and Vy. To achieve this, consider that when Vx>Vy, Q1 tends to source more current to R1 and R2. If this extra current passes through Q1 then Vbe would increase, causing an imbalance in the common-mode detection. To keep the current in Q1 constant, transistor Q8 provides a decreasing current. This results in the total current through Q1 remaining constant. The same effect happens for transistors Q2 and Q7. In this way, the respective base-emitter-voltages Vbe for both Q1 and Q2 are held constant for a wide range of Vx and Vy.

Those skilled in the art will recognize that the detected common-mode voltage satisfies the relationship (Vx+Vy)/2+Vbe. The inclusion of the base-emitter voltage drop is not problematic during operation since it can be cancelled in later stages in a straightforward manner.

For semiconductor tester applications utilizing a differential common-mode comparator, the detected common-mode voltage Vcm is then fed to the respective window comparator inputs (FIG. 3) along the common-mode bus 28 for comparison to the expected predefined threshold common-mode voltage levels Vcmh and Vcml. The results of the comparison are then directed to a failure processor (not shown) for analysis.

Those skilled in the art will appreciate the many benefits and advantages afforded by the present invention. Of particular importance is the implementation of linearization circuitry to extend the linear range of the averaging measurement for a wide range of differential input voltages. This provides a significantly enhanced level of accuracy for the detection of common-mode signals.

While the invention has been particularly shown and described with reference to the preferred embodiments thereof, it will be understood by those skilled in the art that various changes in form and detail may be made therein without departing from the spirit and scope of the invention. For example, while the averaging circuit is described in the context of comparator circuitry for automatic test equipment, it is anticipated that the invention applies equally well to integrated circuit applications requiring any form of common-mode feedback or detection.

Additionally, the common-mode detection circuitry has been described herein primarily in terms of a voltage detector. However, it is anticipated that the present invention may be extended beyond voltage divider schemes disclosed herein by straightforwardly converting the voltage dividers to current divider constructions. This is especially beneficial where the differential input signal comprises complementary current signals, and the desired common-mode signal is a current parameter.

What is claimed is:

1. A common-mode detection circuit for measuring a common-mode signal between two complementary signals, said common-mode detection circuit including:
   a first voltage divider circuit having
      a pair of impedances coupled to define a measurement node and having respective first and second inputs, and
      a pair of active buffer amplifiers having respective first and second outputs for coupling to said first voltage divider first and second inputs; and
   a linearizer having respective first and second inputs cross-coupled to said respective second and first buffer amplifier outputs and operative to maintain both of said buffers in an operational state, said linearizer comprises a second voltage divider circuit formed substantially similar to said first voltage divider circuit.

2. A common-mode detection circuit for measuring a common-mode signal between two complementary signals, said common-mode detection circuit including:
   a first current divider circuit having
      a pair of impedances coupled to define a measurement node and having respective first and second inputs, and
      a pair of active buffer amplifiers having respective first and second outputs for coupling to said first current divider first and second inputs; and
   a linearizer having respective first and second inputs cross-coupled to said respective second and first buffer amplifier outputs and operative to maintain both of said buffers in an operational state, said linearizer comprises a second current divider circuit formed substantially similar to said first current divider circuit.

3. A differential common-mode comparator circuit comprising:
   a window comparator having respective high and low pass buffer amplifiers, said high pass amplifier having a high voltage threshold input and a detected common-mode voltage input, said low pass amplifier having a low voltage threshold input and a detected common-mode voltage input; and
   a common-mode detection circuit for detecting the common-mode voltage of a differential input signal, said common-mode detection circuit including
      a first voltage divider circuit having
         a pair of impedances coupled in series at a measurement node and having respective first and second inputs, and
         a pair of active buffer amplifiers having respective first and second outputs for coupling to said voltage divider first and second inputs; and
      a linearizer having respective first and second inputs cross-coupled to said respective second and first buffer amplifier outputs and operative to maintain a substantially constant current through said buffer amplifiers.

* * * * *